US006993455B2

(12) United States Patent  
Koehle et al.

(10) Patent No.: US 6,993,455 B2  
(45) Date of Patent: Jan. 31, 2006

(54) METHOD FOR DETERMINING THE CONSTRUCTION OF A MASK FOR THE MICROPATTERNING OF SEMICONDUCTOR SUBSTRATES BY MEANS OF PHOTOLITHOGRAPHY

(75) Inventors: Roderick Koehle, Ottobrunn (DE); Reinhard Pufall, München (DE)

(73) Assignee: Infineon Technologies AG, Munich (DE)

( * ) Notice: Subject to any disclaimer, the term of this patent is extended or adjusted under 35 U.S.C. 154(b) by 51 days.

(21) Appl. No.: 11/029,573

(22) Filed: Jan. 5, 2005

(65) Prior Publication Data

US 2005/0148195 A1 Jul. 7, 2005

Related U.S. Application Data

(63) Continuation of application No. PCT/DE03/02160, filed on Jun. 30, 2003.

(30) Foreign Application Priority Data

Jul. 5, 2002 (DE) .............................. 102 30 532

(51) Int. Cl.
*G06F 17/50* (2006.01)

(52) U.S. Cl. .......................... 702/182; 702/30; 702/31; 702/32; 430/5

(58) Field of Classification Search ............ 702/30–32, 702/182; 430/5, 22, 290, 296, 311, 313, 430/314, 320; 257/E21.09, E21.024; 250/492.22, 250/492.3, 548; 359/599, 619; 355/1, 52–54, 355/77; 716/19, 21; 382/144, 213
See application file for complete search history.

(56) References Cited

U.S. PATENT DOCUMENTS

| 4,101,782 A | * | 7/1978 | Seliger .................... 250/492.3 |
| 5,340,700 A | * | 8/1994 | Chen et al. ................. 430/312 |
| 5,895,741 A | * | 4/1999 | Hasegawa et al. ............. 430/5 |

(Continued)

FOREIGN PATENT DOCUMENTS

WO    WO 00/67074    11/2000

OTHER PUBLICATIONS

Alfred K. Wong et al.; "Rigorous Three-Dimensional Time-Domain Finite-Difference Electromagnetic Simulation for Photolithographic Applications"; IEEE Transactions on Semiconductor Manfacturing, Nov. 1995.

(Continued)

*Primary Examiner*—Carol S. W. Tsai
(74) *Attorney, Agent, or Firm*—Baker Botts

(57) ABSTRACT

In the method, which is to be carried out on a computer system, firstly design data of a semiconductor substrate are read in and, on the basis thereof, a mask image is generated in the form of a data structure with contact holes and with auxiliary structures on the computer system. Afterwards, contact hole biases are determined by means of an optical proximity correction method and the relevant contact holes are corrected on the basis of these contact hole biases. By means of subsequent imaging simulation of the mask image on the semiconductor substrate, undesired imaging auxiliary structures and contact holes deviating from specified tolerances on the semiconductor substrate are detected and corrected. During the imaging simulation of the mask image, a mask bias is employed in order to compensate for three-dimensional mask effects. A real mask can be produced on the basis of the mask image thus determined.

27 Claims, 8 Drawing Sheets

U.S. PATENT DOCUMENTS

| | | | |
|---|---|---|---|
| 6,004,699 A * | 12/1999 | Yasuzato et al. | 430/5 |
| 6,020,107 A * | 2/2000 | Niiyama et al. | 430/296 |
| 6,081,659 A * | 6/2000 | Garza et al. | 716/21 |
| 6,236,447 B1 * | 5/2001 | Yamada et al. | 355/53 |
| 6,261,724 B1 * | 7/2001 | Bula et al. | 430/5 |
| 6,610,448 B2 * | 8/2003 | Sato et al. | 430/5 |
| 6,757,645 B2 * | 6/2004 | Chang et al. | 703/13 |
| 6,873,720 B2 * | 3/2005 | Cai et al. | 382/149 |
| 6,883,159 B2 * | 4/2005 | Schenker et al. | 716/21 |
| 2001/0055720 A1 * | 12/2001 | Sato et al. | 430/5 |
| 2002/0015900 A1 * | 2/2002 | Petersen | 430/5 |
| 2002/0018964 A1 * | 2/2002 | Jerominek | 430/313 |
| 2003/0022074 A1 * | 1/2003 | Nolscher | 430/5 |
| 2003/0091911 A1 * | 5/2003 | Noelscher | 430/5 |

OTHER PUBLICATIONS

Andreas Erdmann et al.; "3D Electromagnetic Field Simulation for Low-$K_1$ Lithography"; Microlithography World, Pennwell Publishing, Feb. 2001.

A.K. Wong et al.; "Mask Topography Effects in Projection Printing of Phase-Shifting Masks"; IEEE Transactions on Electron Devices, Jun. 1994.

Wilhelm Maurer et al.; "Proximity Effects of Alternating Phase shift Masks"; SPIE, 1999.

Olivier Toublan et al.; Phase and Transmission Errors Aware OPC Solution for PSM: Feasibility Demonstration; Mentor Graphics, Baccus, 2000.

K. Adam et al.; "Simplified Models for Edge Transitions in Rigorous Mask Modeling": University of California at Berkeley; SPIE, 2001.

* cited by examiner

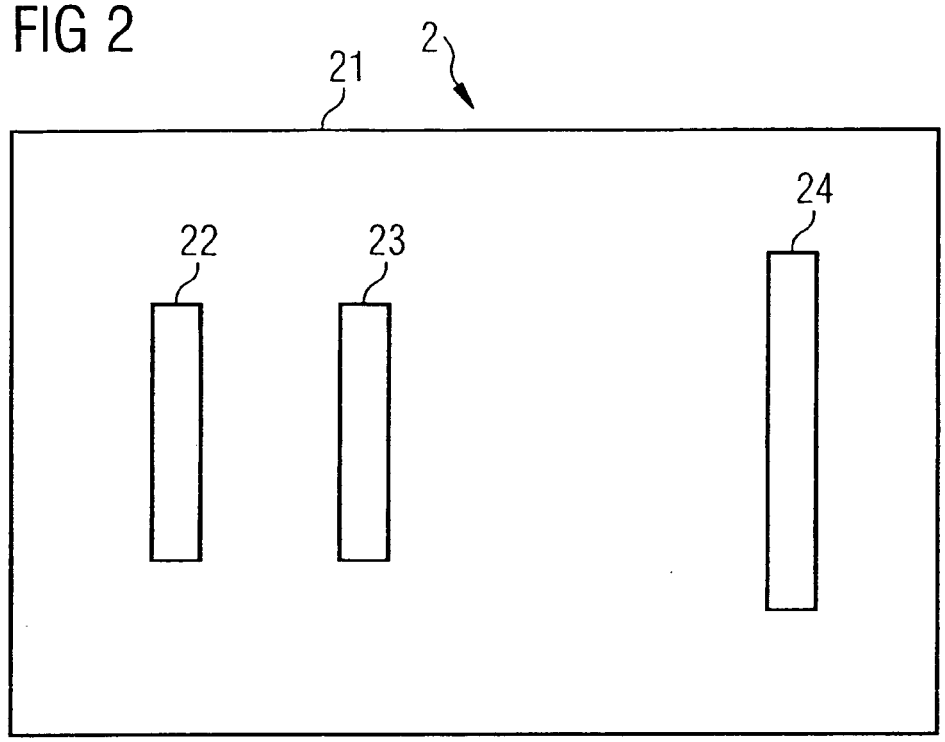
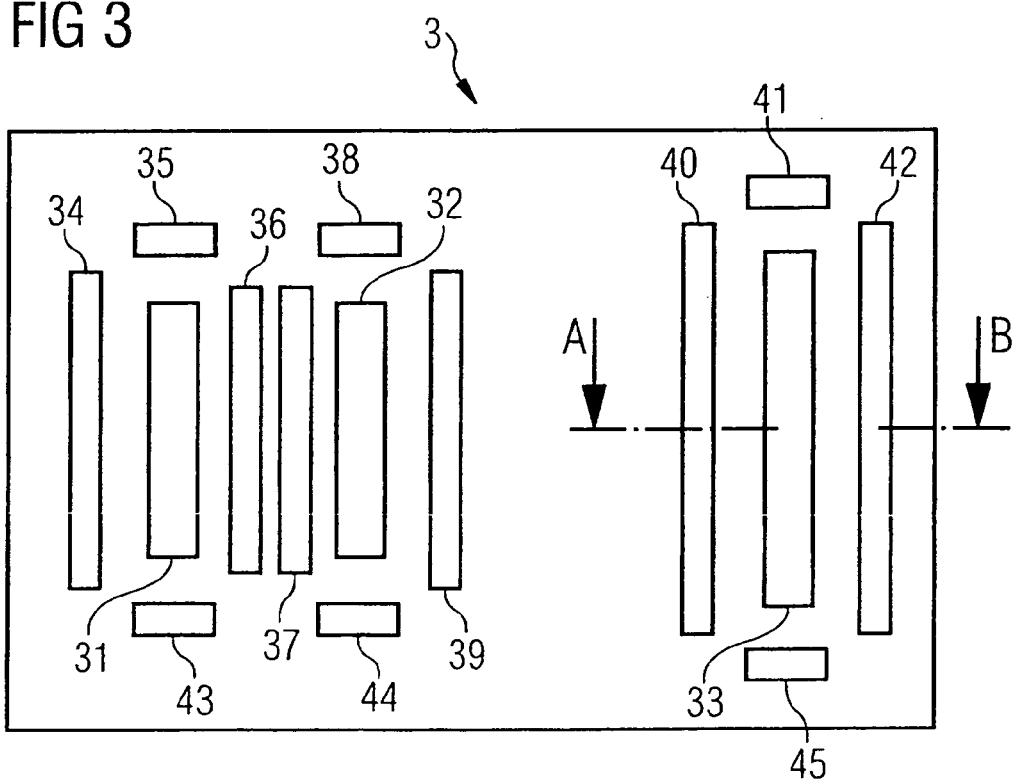

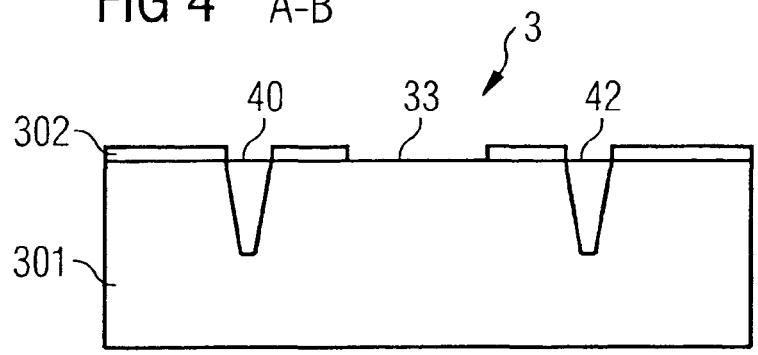
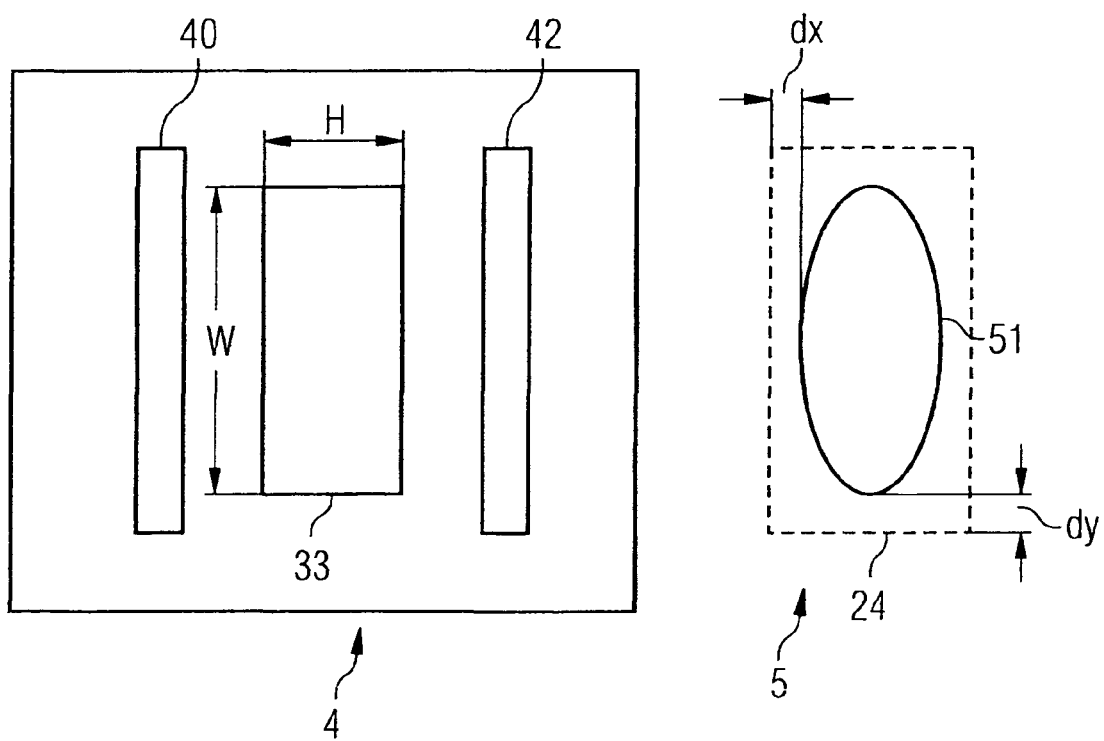

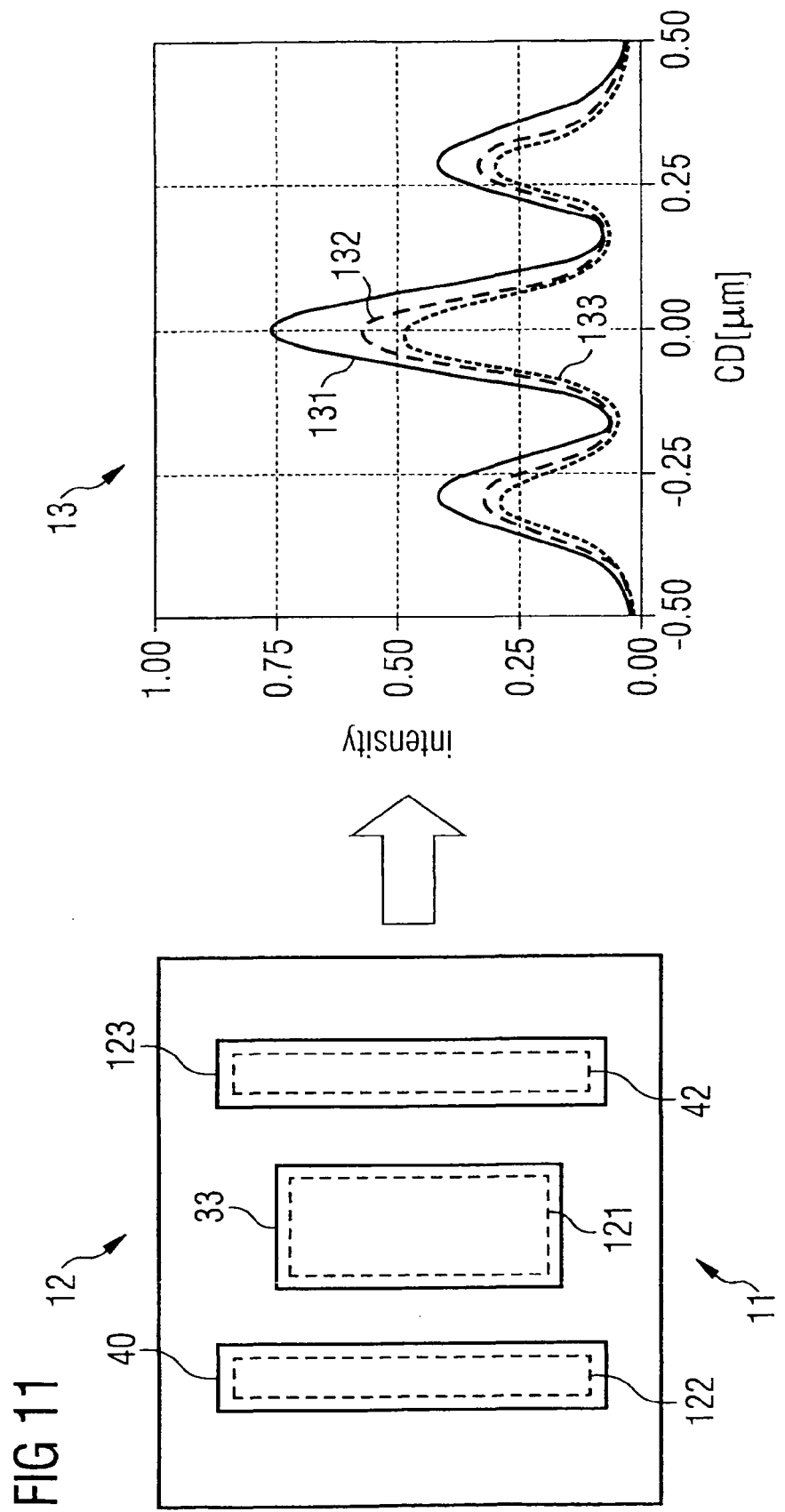

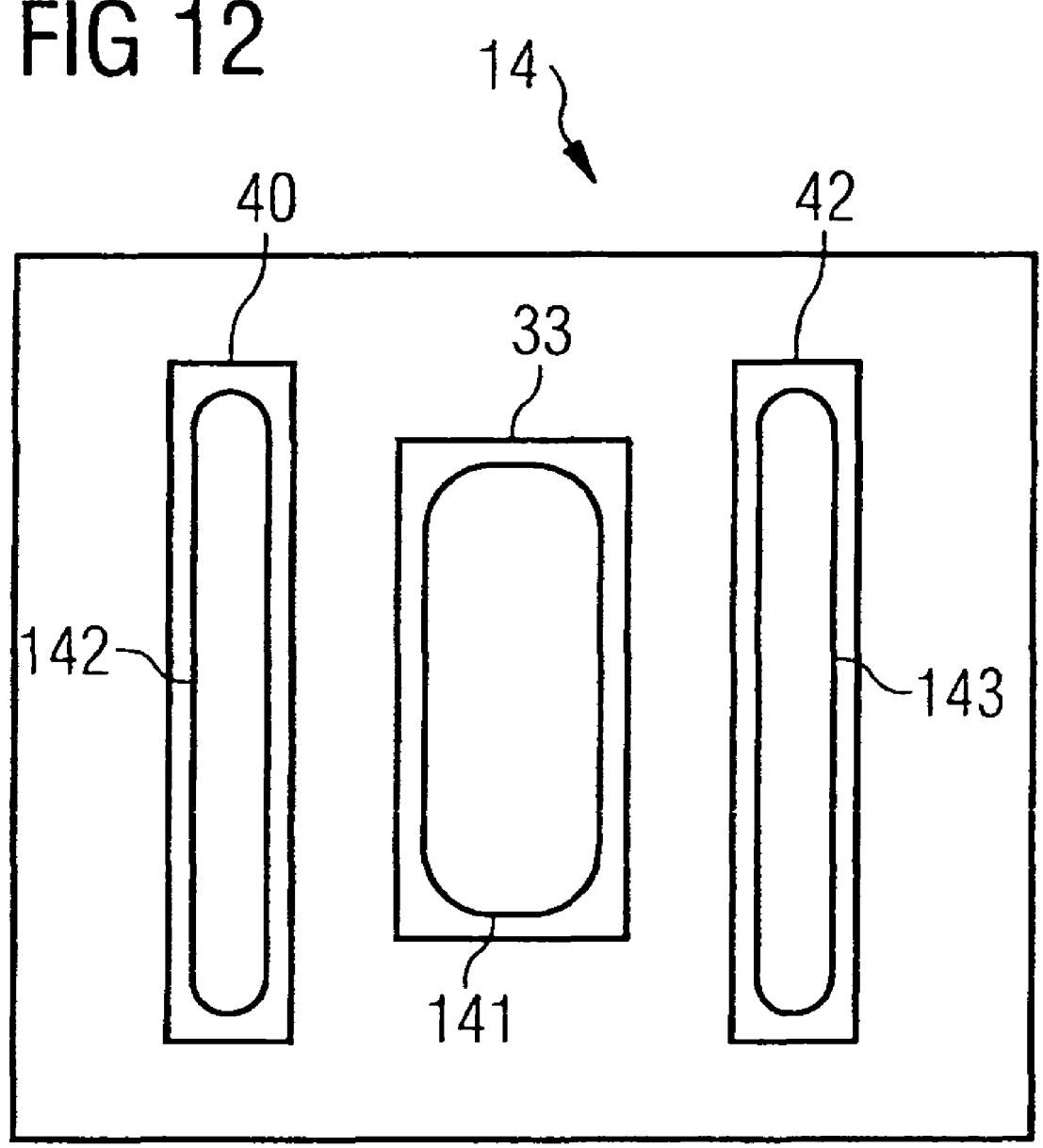

METHOD FOR DETERMINING THE CONSTRUCTION OF A MASK FOR THE MICROPATTERNING OF SEMICONDUCTOR SUBSTRATES BY MEANS OF PHOTOLITHOGRAPHY

CROSS-REFERENCE TO RELATED APPLICATION

This application is a continuation of copending International Application No. PCT/DE03/02160 filed Jun. 30, 2003 which designates the United States, and claims priority to German application no. 102 30 532.3 filed Jul. 5, 2002.

TECHNICAL FIELD OF THE INVENTION

The present invention relates to a method for determining the construction of a mask for the micropatterning of semiconductor substrates by means of photolithography.

DESCRIPTION OF RELATED ART AND BACKGROUND OF THE INVENTION

In the fabrication of semiconductor components, photolithography is often used for the micropatterning of a semiconductor substrate. The task of the photolithography is to transfer structures from a photomask to a semiconductor substrate. In accordance with a basic concept of photolithography, desired regions of a radiation-sensitive photoresist layer on the semiconductor substrate are irradiated in such a way that only the irradiated or only the unirradiated regions can be removed in a suitable developer. The resulting resist pattern on the semiconductor substrate then serves as a mask for the subsequent process step, such as an etching or an ion implantation, for example. The photoresist layer can subsequently be stripped away again.

In this case, the surface of the semiconductor substrate can be irradiated by means of a demagnifying projection exposure in which the image of the photomask, demagnified by means of a lens system, is projected onto the photoresist surface of the semiconductor. The demagnification generally lies between 1 and 10.

In order to improve the photolithography, use is made of simulations with the aid of which it is possible to assess the optical imaging properties during the production of mask structures that are as small as possible and the mask geometry can be optimized. In this case, an optical proximity correction method, disclosed in the document [1], is often employed. This is understood to be the method by which mask structures are altered geometrically in order to improve the imaging properties. In this case, traditional photolithography simulation assumes a simplified and idealized transmission model for the photomask. This is disclosed in document [1].

Whereas this does not pose a problem in conventional binary masks, in phase masks effects occur which can be described by such a transmission model. In a binary mask, a distinction is made only between light-transmissive and light-opaque regions of the photomask. Phase masks are photomasks provided with regions having a different optical path length which effect a phase shift of the light in adjacent regions with respect to one another. Phase masks are subdivided into halftone phase masks, which are coated with a partially light-transmissive material, in particular with molybdenum-silicon, and alternating phase masks or strong phase masks, on which are provided phase-shifting structures which, in contrast to the halftone phase masks, are completely light-transmissive. Colloquially, phase masks are generally often understood to mean the halftone phase masks. A special case of the alternating phase masks is formed by phase assist masks, in which there are phase-shifting auxiliary structures which, however, in contrast to the alternating phase masks, are fashioned so small that they are not imaged. Hereinafter, we will use the term phase masks for the term phase assist masks.

In order to be able to describe the transmission effects of a mask, it is necessary to precisely describe the three-dimensional mask geometry and the material or materials of which the phase assist is composed, and to solve the resulting Maxwell's equations by complex numerical methods. In these methods, the refraction of a light wave incident on the mask, which is given by its electrical and magnetic field components, is calculated and the resulting field distribution at the mask surface is determined.

Due to the high computational complexity, only masks with simple geometries can be analyzed in this way. This makes it more difficult to develop new photolithography solutions and has hitherto precluded the application of photolithography simulations for the optical proximity correction methods.

The documents [2] and [3] disclose the simulation of masks, mask geometry structures for which deviations from the ideal mask model are to be expected being allocated a complex transmission factor. A moderate improvement is possible as a result, but the transmission factor depends very greatly on the mask goemetry and it is therefore very difficult to generalize the method for general mask goemetries. An unsatisfactory simulation result is often produced in the case of mask geometries which deviate from the mask geometries used for determining the transmission factor.

SUMMARY OF THE INVENTION

It is an object of the invention to provide a method by which masks for producing design structures can advantageously be generated. Furthermore, it is an object of the invention to provide a computer program with such a method.

This object can be achieved by a method for determining the construction of a mask for the micropatterning of semiconductor substrates by means of photolithography, the method being carried out on a computer system and comprising the steps of a) read-in of design data of a semiconductor substrate, b) determining the form and the arrangement of contact holes of a mask image present as a data structure, c) determining the form and the arrangement of auxiliary structures in the mask image by means of positioning rules, d) applying a mask bias during the imaging simulation of the mask image for the compensation of three-dimensional mask effects, the mask bias being compared by comparison of a simulated light intensity distribution on the semiconductor substrate with a light intensity distribution on the semiconductor substrate determined experimentally or by means of a rigorous mask simulation, and e) providing the information about the form and about the arrangement of the contact holes and of the auxiliary structures of the mask image for the fabrication of the mask.

This method may after step c), comprise the following steps of c1) determining at least one contact hole bias by means of an optical proximity correction method and changing of the size of the contact holes in the mask image by the contact hole bias or by the contact hole biases, c2) simulating the imaging of the contact holes and of the auxiliary structures of the mask image on the semiconductor substrate, c3) checking whether the auxiliary structures are imaged on the semiconductor substrate during the simulation and/or whether the contact holes on the semiconductor substrate deviate from specified tolerances; if so: sorting of the relevant contact holes and/or of the relevant auxiliary structures according to defect classes, changing of the contact holes and/or of the auxiliary structures in the mask image, and repetition of steps c), c1), c2) and c3).

The object may also be achieved by a method for determining the construction of a mask for the micropatterning of semiconductor substrates by means of photolithography, the method being carried out on a computer system and comprising the steps of a) read-in of design data of a semiconductor substrate, b) determining the form and the arrangement of contact holes of a mask image present as a data structure, c) determining the form and the arrangement of auxiliary structures in the mask image by means of positioning rules, d) taking account of three-dimensional mask effects in the imaging simulation of the mask image on the semiconductor substrate by using a complex transmission factor and/or by using a contact hole bias that can be determined by means of an optical proximity correction method, e) determining the contact hole biases by means of an optical proximity correction method by means of the imaging simulation taking account of the three-dimensional mask effects, and changing of the size of the contact holes in the mask image by the contact hole bias or by the contact hole biases, and f) providing the information about the form and about the arrangement of the contact holes and of the auxiliary structures of the mask image for the fabrication of the mask.

This method may after step e), comprise the following steps e1) simulation of the imaging of the contact holes and of the auxiliary structures of the mask image on the semiconductor substrate by means of the imaging simulation taking account of three-dimensional mask effects, e2) checking whether the auxiliary structures are imaged on the semiconductor substrate during the simulation and/or whether the contact holes on the semiconductor substrate deviate from specified tolerances; if so: sorting of the relevant contact holes and/or of the relevant auxiliary structures according to defect classes, changing of the contact holes and/or of the auxiliary structures in the mask image, and repetition of steps c), d), e), e1), and e2).

In the above described methods, rounded corners of the contact holes and of the auxiliary structures of the mask image can be taken into account during the simulation in step d). The optical proximity correction method can be performed in a rule-based manner. The optical proximity correction method can be performed in a simulation-based manner. In the case of the mask, auxiliary structures or the main structure can be etched anisotropically. In the case of the mask, auxiliary structures or the main structure can be pre-etched anisotropically and undercut isotropically on one side or on two sides. The mask can be a phase assist mask with non-imaging auxiliary structures. The mask can also be a halftone mask with scatter lines. The mask can be a halftone mask with phase auxiliary structures. The mask can be a COG mask with scatter lines.

The object can furthermore be achieved by a computer program with program instructions which cause a computer system to execute one of the methods described above. The computer program may be store or contained within one of the means within the group consisting of: on a storage medium, in a computer memory, in a read-only memory. The computer program may be transmitted on an electrical carrier signal. The object can furthermore be achieved by a carrier medium, in particular data carrier, on which is stored such a computer program containing program instructions which cause a computer system to execute a method for determining the construction of a mask according to the present invention. A computer system may furthermore store such a computer program. The object can also be achieved by a method for loading a computer program for determining the construction of a mask, wherein in one step of the method a computer program as described above is being downloaded from an electronic data network, such as from the Internet, for example, onto a computer system connected to the electronic data network.

The invention relates to a method for determining the construction of a mask which is used for the micropatterning of semiconductor components by means of a photolithography. In this case, use is made of, in particular, demagnifying methods which image the structure of a mask, for example by means of a wafer stepper, onto the surface of a semiconductor substrate. The method according to the invention is a simulation method which is based on the structure to be produced on the surface of the semiconductor substrate and yields as target parameter the geometry of the mask with the contact holes and with the auxiliary structures. To that end, the method according to the invention uses an image of the real mask present as a data structure on a computer system. This method runs on the computer system and provides the progressive processing of the following steps on this computer system.

The design data describe the geometry of the individual planes which are necessary for the fabrication of a semiconductor. The method according to the invention processes those planes which are responsible for the imaging of critical contact hole planes and generates the data necessary for the mask fabrication.

Firstly, the design data of that semiconductor substrate which is to be processed by means of the mask according to the invention are read into a main memory area of the computer system. Proceeding from these design data, a contact plane of the semiconductor substrate is determined. This contact plane is to be understood as the exposed photoresist layer which is produced by means of coating and by means of exposure by a photolithography on the semiconductor substrate. The design data describe the construction of the entire semiconductor wafer. The contact plane considered is usually subdivided into individual regions during simulation methods and during such photolithography methods, it being possible for the subsequent steps to be carried out in each case for one region and to be repeated progressively as often as desired for further regions.

Proceeding from these design data, contact holes of an image of the real mask present as a data structure are determined. In the case of demagnifying methods of photolithography, the mask is made significantly larger than the structures to be produced on the semiconductor substrate. Consequently, the mask image is also made significantly larger than the region to be produced on the semiconductor substrate. The contact holes of the mask image are determined on the basis of geometrical operations, effects caused by the wavelength of the light used being taken into account. The methods to be used for this purpose are relatively familiar to the person skilled in the art.

Afterwards, phase-shifting auxiliary structures are arranged in the mask image and around the contact holes. These auxiliary structures differ from the scatter lines used in conventional halftone masks by virtue of the fact that they effect a phase shift of the light passing through. This phase shift is achieved by etching into the glass substrate at the phase-shifting locations on the mask. This phase etching can be carried out either for the auxiliary structures or for the main structures. The phase difference between adjacent structures is essential for the desired contrast enhancement.

Specifically, a mask used according to the invention is subdivided into a glass plate and a chromium layer, which is arranged on the said glass plate and is made light-opaque or strongly light-absorbing. In reality, the chromium layer is not one hundred percent light-opaque. Depending on the thickness of the chromium layer, residual light to an extent still comes through the chromium-coated regions. In phase masks, this can undesirably influence the image on the surface of the semiconductor substrate.

Whereas the contact holes are formed only by the patterning of the chromium layer, the auxiliary structures are additionally etched a little way into the glass substrate, or vice versa. A path difference in the light wave from the mask as far as the surface of the semiconductor substrate and hence a phase shift of preferably 180° are achieved as a result. As a result, interference effects occur in such a way as to increase the contrast of the contact holes on the surface of the semiconductor substrate. These phase-shifting auxiliary structures are also called phase assists.

The auxiliary structures themselves are too small to be imaged, but they have the effect that the edges of the contact holes have a better contrast. The positioning rules that are usually used for the positioning of auxiliary structures comprise predeterminable distances between auxiliary structures and the edges of the contact holes, predeterminable widths and lengths of auxiliary structures, and minimum distances between contact holes between which auxiliary structures are to be positioned. The application of such positioning rules is known to the person skilled in the art.

The imaging of contact holes on the surface of a semiconductor substrate often gives rise to the problem that the contact holes on the semiconductor substrate turn out to be smaller than is desired. Accordingly, contact hole biases by which the contact holes are enlarged in the mask image are determined in the subsequent method step. In this case, it is possible to provide in each case the same contact hole bias or different biases for the x and y directions and also individually different biases for individual edges of contact holes.

The optical proximity correction method used for determining such biases compares the simulated imaging of contact holes of the mask image which surround auxiliary structures with the design data of the semiconductor substrate and determines the contact hole biases from these differences. The contact holes of the mask image are subsequently corrected on the basis of these contact hole biases. This usually results in an enlargement of the contact hole in the mask image. A demagnification of the contact hole in the mask image is also a conceivable result.

The next method step according to the invention provides the simulation of the imaging of the contact holes and of the auxiliary structures of the mask image thus determined on the semiconductor substrate. Conventional simulation methods based on optical operations are used in this case.

The method step which then follows provides a check of whether there are auxiliary structures in the mask image which are imaged in an undesirable manner during the simulation on the semiconductor substrate, and/or whether there are contact holes on the semiconductor substrate which deviate from the design data of the semiconductor substrate by a value larger than a specifiable tolerance.

If this is the case, the identified contact holes and/or the identified auxiliary structures are sorted according to defect classes. For different defects or deviations, in this case, according to the invention, different correction measures are defined in a table or in a database. By way of example, two adjacent, imaging auxiliary structures may be narrowed in each case or combined to form a single auxiliary structure. The contact holes and/or auxiliary structures of the mask image are subsequently changed on the basis of these correction methods. The method steps according to the invention are then repeated starting from the method step of determination of auxiliary structures on the mask image.

If the check reveals no imaging auxiliary structures and/or no contact holes deviating from specified tolerances, then the method according to the invention continues with the application of a mask bias for the compensation of three-dimensional mask effects.

During an optical simulation, the mask is often abstracted in such a way that it is regarded as an infinitely thin film comprising perfect bright and dark structures (Kirchhoff approximation). When imaging relatively large structures significantly in excessive of the light wavelength, this approximation also corresponds well to the observations actually made. However, the smaller the feature sizes become, the greater the extent to which the imaging on the surface of the semiconductor substrate is affected by effects taking place in the mask, such as refraction and reflection. These effects are not described by the simple optical simulation model. These refraction effects are revealed by a more precise analysis and calculation in which the light propagation in the mask is determined using Maxwell's equations. Therefore, these three-dimensional effects are also referred to as rigorous effects. In practice, these three-dimensional mask effects are often manifested in the fact that the light intensity measured experimentally on the surface of the semiconductor substrate is significantly lower than the light intensity calculated by simulation. Although it is possible, in principle, to use a three-dimensional simulation to achieve a highly true-to-reality image of the actual intensity distribution on the surface of the semiconductor substrate, such a three-dimensional simulation is ruled out for application in a method according to the invention for determining the construction of a mask since it is extremely intensive in respect of computation time and memory space. In this case, the invention takes the path of using a two-dimensional simulation, but of approximating the simulation to a three-dimensional simulation by the determination and application of a mask bias.

The invention's mask bias for the compensation of three-dimensional mask effects is determined by comparing the simulated light intensity distribution on the surface of the semiconductor substrate with an actually measured intensity distribution determined experimentally or else a rigorous mask simulation (by solving Maxwell's equations). A mask bias can be calculated from this, the auxiliary structures, in particular, being furnished with said bias. It is also possible to apply such a mask bias to the contact holes. Said mask bias is often configured such that the very narrow auxiliary structures are widened in order thus to increase their light transmissivity. This method step is a so-called post-processing step.

Finally, the information thus generated about the arrangement and the nature of the contact holes and of the auxiliary structures is profiled for the fabrication of the mask.

One basic concept of the invention consists in specifying a computer-implemented method for determining the construction of a mask, which can be used to fabricate, in a largely automated manner, very small structures in the size range of the light wavelength on semiconductor substrates.

For this purpose, the method according to the invention generates an image of a real mask on the computer system and combines optical proximity correction methods for the optimized alignment of contact holes and auxiliary structures in the mask image used with an improved, automatic adaptation of the imaging simulation used to reality. In this case, a mask bias is determined and employed in the two-dimensionally operating imaging simulation used, the imaging simulation used being made truer to reality by said mask bias.

In accordance with a further basic concept of the invention, precisely determined correction possibilities are provided for different contact holes and auxiliary structures and for various arrangements of contact holes and auxiliary structures. Thus, in the case where undesirably imaging auxiliary structures are detected, these auxiliary structures can be shifted, made smaller or partly removed. The correction possibilities: "changing the dimensioning of the contact holes" and "changing the auxiliary structures surrounding the contact holes" are possible when imaging contact holes.

The method according to the invention makes it possible, based on the design data of a semiconductor substrate, in a rapid and convenient manner, to produce a true-to-reality mask image for fabricating a real mask, on the basis of which a real mask can be produced in a simple manner.

If there is some change to the optical properties of the mask on the basis of a changeover in the mask fabrication process, then, in the case of this method according to the invention, only the postprocessing step has to be repeated, not the preceding steps. By way of example, the corresponding correction biases change depending on whether a phase etching is carried out in the case of the auxiliary structures or in the case of the main structure.

The invention also relates to a method for determining the construction of a mask for the micropatterning of semiconductor substrates by means of photolithography, in which the simulation correction is integrated as part of the optical proximity correction method. This results in greater flexibility in the determination of the construction of a mask. The method steps of read-in of design data of a semiconductor component, determination of the form and the arrangement of contact holes of a mask image present as a data structure and determination of the form and the arrangement of auxiliary structures in the mask image by means of positioning rules correspond to the method steps of the method already described.

In the case of this method according to the invention, the three-dimensional mask effects described above are already taken into account in the next method step during the simulation. This taking-into-account is effected either by using a complex transmission factor during the simulation and/or by using a contact hole bias that can be determined by means of an optical proximity correction method during the simulation. The complex transmission factor and/or the contact hole bias plays a part only for the subsequent simulation; they do not directly affect the mask image.

In the subsequent method step according to the invention, the contact hole biases for the mask image are determined by means of an optical proximity correction method. In this case, the simulation is carried out with the transmission factor and/or contact hole bias determined in the previous method step. The contact holes in the mask image are corrected by the contact hole bias thus determined for the mask image or by the contact hole biases thus determined for the mask image.

The imaging of the contact holes and of the auxiliary structures of the mask image on the semiconductor substrate is then simulated. The simulation used in this case has recourse to the transmission factor and/or contact hole bias determined in the last method step but one. In a subsequent check, it is ascertained whether, in an undesirable manner, auxiliary structures are imaged on the semiconductor substrate during the simulation and/or whether the contact holes on the semiconductor substrate deviate from predeterminable, specified tolerances. If this is the case, the contact holes and the auxiliary structures are sorted according to defect classes and the contact holes and/or the auxiliary structures are changed on the basis of predeterminable correction measures. These correction measures have been determined in the preliminary stages of the method and preferably assembled in tabular form or in the form of a database. Specific correction measures, in particular the changing of dimensions and the combination of auxiliary structures, are provided for different types of defects, in particular for imaging auxiliary structures or for contact holes that deviate greatly from the design data. For the contact holes and/or auxiliary structures changed in this way, the method steps are repeated beginning with the determination of the form and the arrangement of auxiliary structures in the mask image.

If the check reveals no undesired imaging auxiliary structures and no contact holes that deviate from the specified tolerances, then the information about the form and about the arrangement of the contact holes and of the auxiliary structures of the mask image is made available for the fabrication of a real mask.

By means of the method according to the invention, it is advantageously possible, through computer simulation, to determine a mask image which images desired design data of a semiconductor component in a manner highly true to reality and on the basis of which a real mask can be produced. The incorporation of the three-dimensional mask effects into the simulation which is used for the determination of the contact hole biases and for the simulation of the imaging of the mask image results in a highly flexible and very precise imaging of the real photolithography.

In accordance with one embodiment of this method, rounded corners of the contact holes and of the auxiliary structures in the mask image are taken into account during the simulation. This method step is based on the insight that, during a photolithography, right-angled corners of contact holes of a mask usually appear as rounded forms on the surface of the semiconductor substrate. This characteristic of the photolithography is now taken into account in the computer-based simulation used according to the invention. This results in a mask image which can be used to produce a real mask which images the contact holes that come very near to the desired design data on the surface of a semiconductor substrate.

The proximity correction methods which can be used according to the invention are subdivided into rule-based and simulation-based optical proximity correction methods.

In rule-based optical proximity correction methods, isolated structures, in particular individual contact holes on the mask are considered and have biases applied to them, which biases can be predetermined depending on various deviations. These biases are often stored in tables or in databases and have been determined by experiments. The rule-based optical proximity correction method is a method which can be performed rapidly with reasonable computational complexity.

In simulation-based optical proximity correction methods, contact holes and auxiliary structures are considered in context and individual biases for correcting the contact holes and the auxiliary structures are determined depending on this context. Such simulation-based optical proximity correction methods require a greater outlay in respect of computation time and memory than rule-based optical proximity correction methods. Results that are more precise and truer to reality are obtained with the simulation-based optical proximity correction methods.

The method according to the invention can be used for masks which have small and/or etched structures. Such structures bring about refraction and reflection effects, in particular rigorous mask effects, during the photolithography. In this case, it is essential that such etched structures bring about a phase difference in the light wave passing through the mask. In this case, either the auxiliary structures can be etched and the main structure left unetched or the main structure can be etched and the auxiliary structures left unetched.

The method according to the invention is suitable for masks in which the auxiliary structures or the main structure are etched anisotropically. The method according to the invention is likewise suitable for masks in which the auxiliary structures or the main structure are pre-etched anisotropically and then undercut isotropically on one side or on two sides.

The method can be used particularly advantageously for phase assist masks or auxiliary structure masks with non-imaging auxiliary structures. The method according to the invention can also be used to determine the construction of alternating phase masks, halftone masks with scatter lines or with phase auxiliary structures and COG masks with scatter lines.

The invention is also realized in a computer program for executing a method for determining the construction of a mask for the micropatterning of semiconductor substrates by means of photolithography. In this case, the computer program contains program instructions which cause a computer system to perform such a method in an embodiment described above.

The computer program outputs as the result the construction or the structure of the mask image determined with all the contact holes and auxiliary structures on an output unit, in particular on a screen or on a printer. The most important output medium in this case is the mask writer. On the basis of this information, it is possible to produce a real mask which can be used to produce structures on a semiconductor substrate which come very near to the predetermined design data.

The computer program improved according to the invention results in a truer-to-reality and more precise determination of the construction of a mask compared with the known methods for determining the construction of a mask for the micropatterning of semiconductor substrates by means of photolithography. Furthermore, the computer program improved according to the invention also makes it possible to determine extensive and complex masks which conventional methods were unable to stimulate.

The invention additionally relates to a computer program which is contained on a storage medium, which is stored in a computer memory, which is contained in a read-only memory, or which is transmitted on an electrical carrier signal.

The invention also relates to a carrier medium, in particular a data carrier such as, for example, a floppy disk, a zip drive, a streamer, a CD-ROM or a DVD-ROM, on which a computer program described above is stored. Furthermore, the invention relates to a computer system on which such a computer program is stored. Finally, the invention relates to a method in which such a computer program is downloaded from an electronic data network, such as from the Internet, for example, onto a computer connected to the data network.

To summarize, it can be stated that the invention also relates to the aspects of simulation methodology, parameter determination, partitioning and optical proximity correction process flow.

Simulation methodology takes account of the light transmissivity and the phase of the absorbing chromium layer and, in the case of small structures in which the structure width is less than four times the wavelength, the polarization effects during mask illumination.

In parameter determination, a set of trench depths or phases $P=\{P1, P2, \ldots\}$ is defined, at least two phases (0°, 180° ranges) being provided for the partitioning of the layout. In this case, it is understood that the term trench means a trench etched into the mask. Furthermore, a set of feature sizes $S=\{S1, S2, \ldots\}$ is defined for the layout partitioning. Moreover, use is made of a transmission function in dependence on bias, transmission value and phase for each partition ($S \times P1$ using a weighted least squares algorithm on the far field, calculated by means of a rigorous simulation, for the determination of the parameters. In this case, the term far field means the electric field strength at an infinite or large distance from the mask. In contrast thereto, near field is understood to be the electric field strength at the mask surface.

Partitioning consists in the division of the layout according to etching depth or phase or according to feature size. A simple case for feature size partitioning is recorded when using phase assist structures. Since these assist structures are generated automatically, the layout can be divided by the assist generation.

The optical proximity correction process below comprises the integration of the 3D correction into the simulation by applying the adaptation parameters to the design before carrying out the simulation or the post-processing of the two-dimensional optical proximity correction corrections with a bias dependent on the local width and phase.

In accordance with a further aspect of the invention, the direction of polarization of the illumination is taken into account for small line structures. The incident light is attenuated to different extents depending on the direction of polarization. For the simulation, separate adaptation values have to be determined in this case, depending on the direction of polarization. In this case, a distinction is made between TE polarization and TM polarization. In the case of TE polarization, the electric field is oriented parallel to the line structures, whereas in the case of TM polarization, the magnetic field is oriented parallel to the line structures. For the optical simulator, this means that two directions of polarization are calculated separately and the resulting light intensity on the semiconductor wafer is added in incoherent fashion. For the optical proximity correction, after the simulation, correction values for the mask layout are derived from the comparison between the resulting aerial image and the target design. This simulation and correction cycle is iterated a number of times until a predeterminable termination criterion is met.

BRIEF DESCRIPTION OF THE DRAWINGS

The invention is illustrated in more detail in the drawing on the basis of two exemplary embodiments.

FIG. 2 shows a semiconductor substrate design with a resist layer having exposed resist layer sections, FIG. 3 shows a plan view of a first phase mask for producing the semiconductor substrate design from FIG. 2 on the surface of a semiconductor substrate by means of a photolithography, FIG. 4 shows a cross section through the first phase mask along the cross-sectional line A-B represented in FIG. 3, FIG. 5 shows a phase mask region of the first phase mask represented in FIG. 3, and also a bias-determining representation, FIG. 11 shows a simulation adaptation representation with a plan view of a second simulation-corrected phase mask region and also with a transmission representation, FIG. 12 shows a plan view of a third simulation-corrected phase mask region.

DETAILED DESCRIPTION OF EMBODIMENTS

Figure 1:
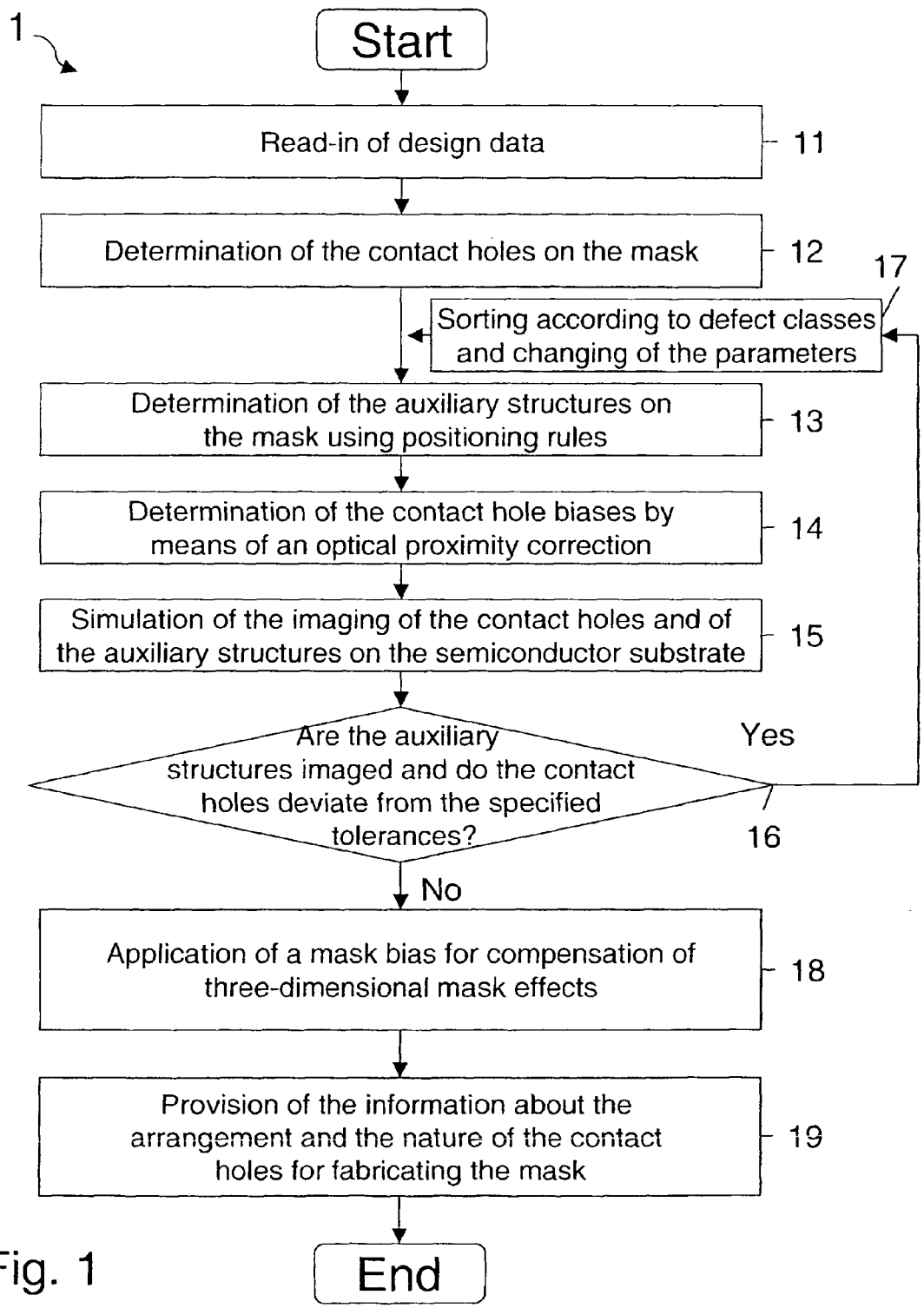
FIG. 1 shows a first flow diagram for illustrating a first method according to the invention for determining the construction of a mask.

FIG. 1 shows a first flow diagram 1 for illustrating the method steps 11 to 19 of a first method according to the invention for determining the construction of a mask.

In this case, the method steps 11 to 19 are carried out exclusively on a computer system that is not represented in FIG. 1. An image of a mask is created and optimized on the computer system below. In this case, mask image is understood to mean the description of the real mask by means of data, said description being created on the computer system.

In the first method step 11, design data are read into a main memory area of the computer system. In this case, the design data represent the surface structure to be produced on the semiconductor substrate, in particular on the semiconductor wafer. In this case, the design data comprise a plurality of planes, precisely one plane being selected for the method according to the invention. This plane is the contact plane of the semiconductor substrate. The contact holes present on the contact plane of the semiconductor substrate are firstly identified and then sorted according to their size.

On the basis of this information, in a second method step 12, the contact holes are determined on the mask image. Methods known to the person skilled in the art are used in this case. The photolithography considered according to the invention is, in particular, a demagnifying photolithography by which the structures present on the mask are imaged on the semiconductor substrate in a manner demagnified by an imaging factor of usually 4 or 5. Accordingly, proceeding from the contact holes to be produced on the semiconductor substrate, in the context of the method according to the invention, contact holes which are enlarged approximately by the imaging factor are produced on the mask image.

In the subsequent third method step 13, auxiliary structures are determined on the mask image, said auxiliary structures having a defined size and being situated at a respectively defined distance beside or between the contact holes on the real mask. These auxiliary structures are ideally not imaged during a projection of the mask structures onto the semiconductor substrate, but rather serve to increase the contrast of the contact holes on the semiconductor substrate and accordingly to produce more clearly patterned contact holes on the semiconductor substrate or to reinforce the edges of the contact holes on the semiconductor substrate. Positioning rules familiar to the person skilled in the art are used when determining the auxiliary structures on the mask.

In this case, the auxiliary structures are preferably arranged in such a way that they have a phase shift of 180° relative to the contact holes. In this case, the auxiliary structures are etched into the glass substrate of the mask with a different depth from the main structure, so that this etching depth of the auxiliary structures results in a propagation time or path difference in the light wave between the auxiliary structures and the contact holes. This path difference can be calculated from the etching depth of the auxiliary structures, from the thickness of the glass layer and from the speed of light c, which assumes a value of 300,000 km/s in vacuum or in air and a value of approximately 200,000 km/s in glass. The relationship between the phase difference j in degrees and a depth difference d is given by the following relationship:

$$d = j/360° \; l/(n-1),$$

where l is the light wavelength and n is the refractive index of the glass substrate.

Such an auxiliary structure taking account of a phase shift of the light wave results in better contrast enhancement on the semiconductor substrate than with customary, non-etched scatter bars, which do not effect a phase shift of the light wave.

The next, fourth method step 14 according to the invention provides the determination of contact hole biases by means of an optical proximity correction method. This method step is based on the problem that deviations from the desired structure result during the projection of the mask onto the surface of the semiconductor substrate. An optical proximity correction method familiar to the person skilled in the art is employed in order to correct these deviations. This simulates the projection of regions of the mask image onto the surface of the semiconductor substrate and determines, on the basis of a comparison of the mask region to be imaged with the simulated imaging, correction biases which can be used to correct the contact holes and/or the auxiliary structures on the mask. By means of this optical proximity correction method, the contact holes or the main structures are dimensioned by determining biases and correcting the main structure or the contact holes with these biases.

Biases can be provided by different methods in this case. Thus, the same bias can be provided in each case on all the edges of the contact holes or the auxiliary structures on the mask. As an alternative to this, it is possible to provide different biases on edges of different lengths of differently formed contact holes and auxiliary structures.

In this case, the optical proximity correction methods are subdivided into rule-based and simulation-based methods. In the rule-based methods, isolated structures, in particular individual contact holes, on the mask are considered and individual biases are applied to them on the basis of already determined correction information ideally stored in tables. The correction information contained in these tables has ideally been determined in the preliminary stages of carrying out the optical proximity correction method by means of experiments or by means of simulations. In the rule-based optical proximity correction methods, the contact holes are generally considered in isolation.

The simulation-based optical proximity correction methods are based on the requirement of considering a plurality of adjacent contact holes and auxiliary structures and of determining individual biases taking account of the relation of a plurality of contact holes and a plurality of auxiliary structures by means of simulation, which biases can be used to correct the contact holes and/or auxiliary structures considered.

The imaging of the contact holes and of the auxiliary structures of the mask image on the semiconductor substrate is simulated in the next method step 15 according to the invention. Computer-implemented methods which are based on optical projection models and which take account of the waveform of the light wave are used in this case. Such simulation methods are also referred to a full chip simulations and are familiar to the person skilled in the art.

The simulated imaging of the contact holes and of the auxiliary structures on the semiconductor substrate is analyzed in the subsequent, sixth method step 16. In this case, a check is made to determine whether there are auxiliary structures on the mask image which are imaged in an undesirable manner on the semiconductor substrate. Furthermore, in this method step 16, a check is made to determine whether the imaged contact holes deviate from specified tolerances. Such specified tolerances may be length and width values and also distance values.

If a defect is ascertained in this method step 16, then firstly the detected defects are sorted according to defect classes, then the corresponding parameters are changed and, finally, method steps 13 to 16 are repeated.

In method step 17, the defects ascertained are sorted according to defect classes. In this case, by way of example, the auxiliary structures which are imaged in an undesirable manner are captured or the contact holes that deviate from the specified tolerances are stored. The defective auxiliary structures or contact holes are then corrected by changing parameters. There are a multiplicity of conceivable correction possibilities in this case, for example changing widths and lengths of auxiliary structures or contact holes, changing the form of auxiliary structures or erasing and adding auxiliary structures. The method according to the invention provides an automatic change of these parameters. In this case, respective individual correction parameters are ideally provided for different defects. It is conceivable at this point that only one defect, a plurality of defects or even a multiplicity of defects are detected in method step 16. These defects can be corrected in an automated manner in method step 17.

In accordance with FIG. 1, the method steps 13 to 17 are repeated until the check in method step 16 reveals no imaged auxiliary structures and no deviation of the contact holes from the specified tolerances. For this case, the next method step performed is the eighth method step 18, in which a mask bias is applied in order to compensate for three-dimensional mask effects.

In the simulation of the imaging of the contact holes and of the auxiliary structures of the mask image on the semiconductor substrate, idealized, two-dimensional projection models are used for reasons of speed. The light intensities on the surface of the semiconductor substrate which are calculated with such two-dimensional simulation models deviate from the actual light intensity measured experimentally during the exposure of a semiconductor substrate with a corresponding real mask. This is because in reality the structures found on the surface of the semiconductor substrate are significantly darker than those found by means of the simulation calculation. In this case, it can happen that contact holes provided on the mask appear too small or do not appear at all on the surface of the semiconductor substrate. Semiconductor chips can become unusable as a result of such effects. Although there are three-dimensional simulation models which produce a truer-to-reality calculation of the light intensity, they have significantly greater computational complexity and are therefore not suitable for use in such a simulation method.

Therefore, a mask bias is determined in method step 18, which mask bias is applied to the auxiliary structures. The auxiliary structures are enlarged by means of this mask bias. It is furthermore conceivable to provide a mask bias for the contact holes as well, by means of which the contact holes on the mask are enlarged. All the points described below for the auxiliary structures can also be applied analogously to the contact holes.

In this case, the application of the mask bias to the auxiliary structures in accordance with method step 18 can be effected by enlarging or widening the auxiliary structures and by undercutting the glass plate of the mask. In this case, the term undercutting is understood to mean the removal, by means of an etching method, of those regions of the glass plate which lie directly under the chromium layer of the mask and directly adjoining the auxiliary structure. This results in reduction of the scattering factor and of the loss of energy at the edges of the auxiliary structure. Such auxiliary structures lead to brighter and more sharply imaging edges on the surface of the semiconductor substrate.

In practice, the problem arises that the auxiliary structures are often very narrow and that therefore only very little light passes through the auxiliary structures and is imaged on the surface of the semiconductor substrate. This effect is significantly more highly pronounced in the case of the auxiliary structures than in the case of the contact holes since the contact holes are generally made larger than the auxiliary structures. Consequently, in the case of many auxiliary structures, the problem arises that the intended reinforcement of the edges of the contact holes on the surface of the semiconductor substrate does not occur since too little light passes through the auxiliary structures. This problem is solved according to the invention by virtue of the fact that a mask bias is applied to the auxiliary structures and the auxiliary structures are thereby reinforced.

In the concluding method step 19, the information about the contact holes and auxiliary structures of the mask image which have been modified according to the invention is assembled. This information is used to fabricate a real mask for the photolithography.

FIG. 2 shows a semiconductor substrate design 2 with a resist layer 21 having exposed resist layer sections 22 to 24.

The resist layer 21 is represented as a rectangular grey-shaded area in FIG. 2. In the middle left-hand region of the resist layer 21, two exposed resist layer sections 22 and 23 are arranged edgeways as rectangles one beside the other. In the middle right-hand region of the resist layer 21, a third exposed resist layer section 24 is arranged edgeways as a rectangle. This resist layer section 24 is made with the same width but a little higher than the exposed resist layer sections 22 and 23.

The semiconductor substrate design shown in FIG. 2 represents the surface design of the resist layer 21 that is to be produced on the semiconductor substrate. This resist layer 21 with the exposed resist layer sections 22 to 24 is intended to be applied to the surface of a semiconductor substrate (not shown here) in demagnified fashion by means of a photomask. In the exemplary embodiment, the graphic representation shown in FIG. 2 is present in the form of geometrical data on a memory area of the computer system.

FIG. 3 shows a plan view of a first phase mask 3 for producing the semiconductor substrate design 2 on the surface of a semiconductor substrate by means of a photolithography.

The first phase mask 3 is subdivided into a glass substrate and a chromium layer arranged above the latter. In this case, the first phase mask 3 has the contact holes 31 to 33, which are provided in order to produce the exposed resist layer sections 22 to 24 in accordance with FIG. 2. The contact holes 31 to 33 are formed as cut-out regions of the chromium layer.

Auxiliary structures 34 to 45 are arranged around the contact holes 31 to 33. These auxiliary structures 34 to 45 are formed as cut-out regions in the chromium layer and additionally as etchings extending into the glass plate. The auxiliary structures 34 to 45 are in each case arranged at a predetermined distance from the edges of the contact holes 31 to 33 and have a length which in each case slightly exceeds the corresponding edge. The auxiliary structures 34 to 45 themselves are too narrow to be imaged on the surface of the semiconductor substrate. Their width is typically of the order of magnitude of the light wavelength. For ArF lithography, the assist width is ~280 nm and the wavelength ~193 nm. What is achieved by virtue of these auxiliary structures 34 to 45, however, is that the edges of the exposed resist layer sections 22 to 24 on the resist layer 21 to be produced have a better contrast.

In accordance with FIG. 3, there are in each case four auxiliary structures 34 to 45 arranged around each of the three contact holes 31 to 33. The auxiliary structures 36 and 37 arranged between the contact holes 31 and 32 are arranged at a small distance next to one another.

In a cross-sectional line A/B extending horizontally through the auxiliary structure 40, through the third contact hole 33 and through the auxiliary structure 42 is provided on the right-hand side of the first phase mask 3.

FIG. 4 shows a cross section through the first phase mask 3 along the cross-sectional line A/B represented in FIG. 3.

In accordance with FIG. 4, the first phase mask 3 is subdivided into a relatively thick glass plate 301 and a chromium layer 302, which is arranged on said glass plate 301 and is fixedly connected thereto. It can be seen in accordance with FIG. 4 that the third contact hole 33 and all further contact holes (not shown here) are embodied only as cut-outs in the chromium layer, whereas the auxiliary structures 40 and 42 and all further auxiliary structures (not shown here) are embodied both as cut-outs in the chromium layer and as etchings in the glass plate 301 arranged below said cut-outs, the representation in FIG. 4 diagrammatically representing the properties of the etching trenches. The etchings extend to a depth of approximately 170 nm, the thickness of the glass substrate being 5–7 mm. The tapering of the edges of the etching trenches is dependent on the respective etching process, but can influence the optical properties of a trench.

FIG. 5 shows a phase mask region 4 of the first phase mask 3 represented in FIG. 3, and a bias-determining representation 5.

The phase mask region 4 comprises the third contact hole 33 and the auxiliary structures 40 and 42 arranged next to this contact hole 33 to the right and left. The width H and the height W of the third contact hole 33 are illustrated by arrows in FIG. 5.

The bias-determining representation 5 is subdivided into an imaging dimension 51, shown oval in the representation, and the third exposed resist layer section 24 of the resist layer 21. The bias-determining representation 5 shows the simulated imaging of the phase mask region 4 on the surface of a semiconductor substrate (not shown here). This simulation yields the imaging dimension 51, namely an oval form of the contact hole 33 of the resist layer 21 that is formed such that it is significantly smaller than the expected third exposed resist layer section 24.

A horizontal bias dx and a vertical bias dy can be determined from the comparison between the simulated imaging dimension 51 and the expected exposed resist layer section 24. These biases result in each case from the difference between the outer regions of the imaging dimension 51 and the edges of the third exposed resist layer section 24. These biases dx and dy enable an iterative correction of the width and height of the third contact hole 33 according to the formulae mentioned below:

$$W' = W + \gamma \cdot dy$$

$$H'H = H + \gamma \cdot dx$$

In this case, the variable W' represents the new vertical dimension of the contact hole 33, corrected by the value $\gamma \cdot dy$. The variable H' represents the horizontal dimension of the third contact hole 33 corrected by the value of $\gamma \cdot dx$. The value g represents a weighting factor for this gradient method in order to ensure the stability of the iterative correction. g typically lies in the range of $\{0.1 \ldots 1\}$. This bias correction according to the invention reduces the deviation of the imaging dimension 51 actually achieved from the expected resist layer section 24.

Figure 6:
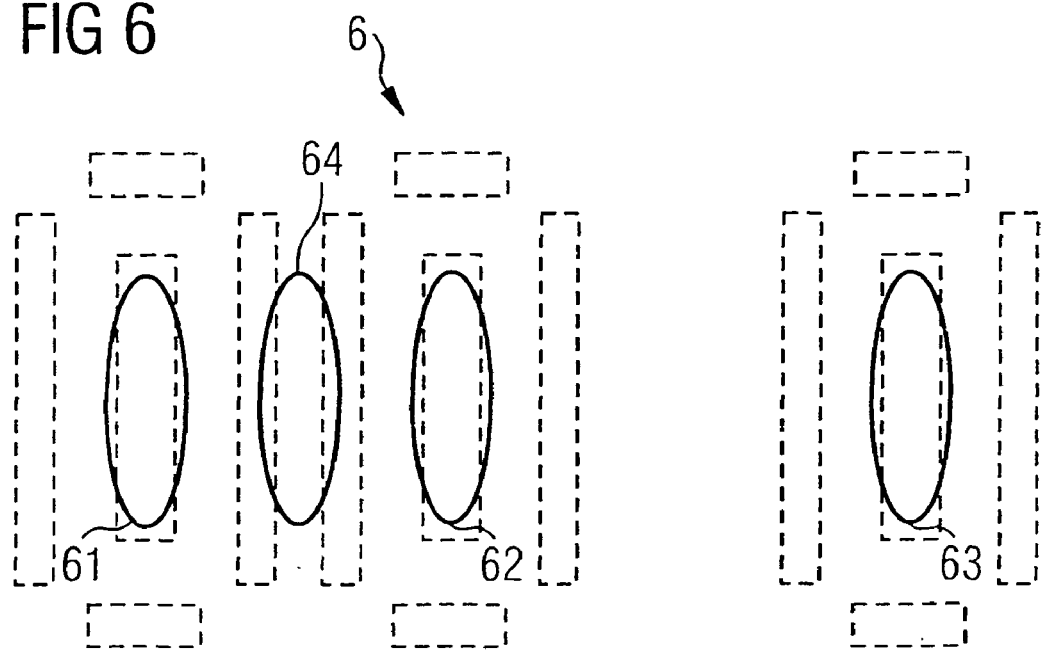
FIG. 6 shows a first simulation representation of the imaging of the first phase mask shown in FIG. 3 on the surface of the semiconductor substrate.

FIG. 6 shows a first simulation representation 6 of the imaging of the first phase mask 3 shown in FIG. 3 on the surface of the semiconductor substrate.

In this case, the first simulation representation 6 is subdivided into a first contact hole imaging 61, a second contact hole imaging 62, a third contact hole imaging 63 and an auxiliary structure imaging 64. These imagings each have an oval form. For reasons of better illustration, the contact holes 31 to 33 and the auxiliary structures 34 to 45 of the first phase mask 3 are represented by broken lines behind the contact hole imagings 61 to 63 and behind the auxiliary structure imaging 64. As a result, it is evident that the contact holes 31 to 33 image in each case onto the contact hole imaging 61 to 63 and that the auxiliary structures 36 and 37 effect the undesired imaging of the auxiliary structures 64.

Figure 7:
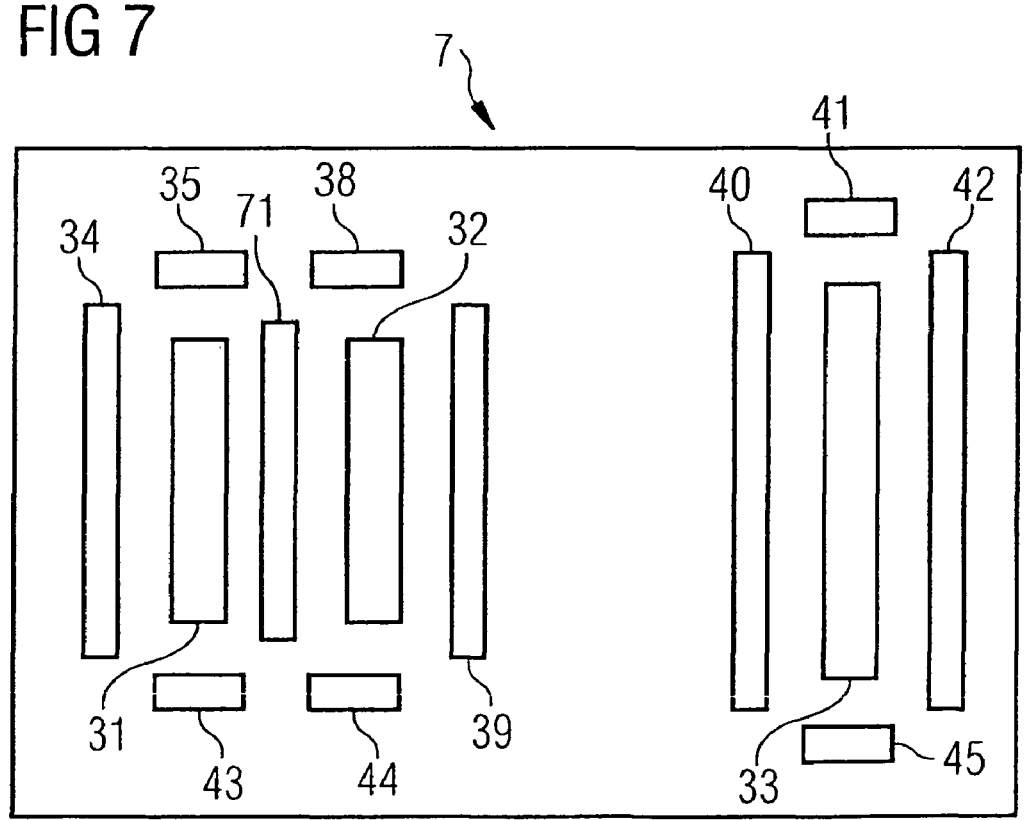
FIG. 7 shows a plan view of a bias-corrected second phase mask for producing the semiconductor substrate design from FIG. 2 on the surface of a semiconductor substrate by means of a photolithography.

FIG. 7 shows a plan view of a bias-corrected second phase mask 7 for producing the semiconductor substrate design 2 from FIG. 2 on the surface of a semiconductor substrate by means of a photolithography.

With regard to the construction, the second phase mask 7 corresponds to the first phase mask 3, with the difference that the auxiliary structures 36 and 37 are replaced by the corrected auxiliary structure 71. Consequently, there is now a single narrow corrected auxiliary structure 71 provided between the first contact hole 31 and the second contact hole 32, which auxiliary structure has a rectangular form, is oriented edgeways and is made a little higher than the contact holes 31 and 32.

Figure 8:
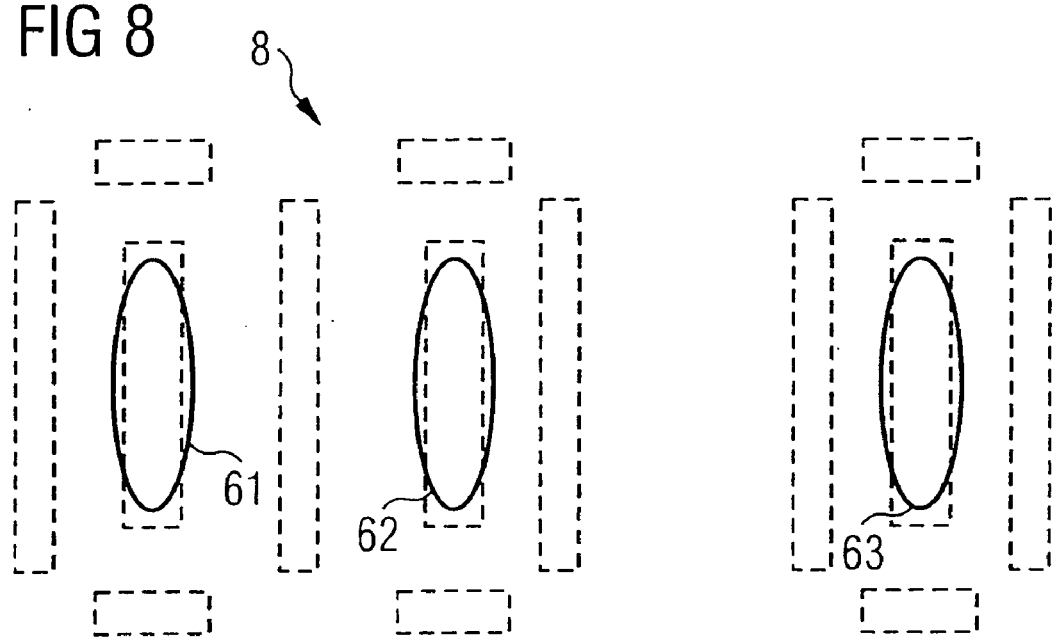
FIG. 8 shows a second simulation representation of the imaging of the second phase mask shown in FIG. 7 on the surface of the semiconductor substrate.

FIG. 8 shows a second simulation representation 8 of the imaging of the second phase mask 7 shown in FIG. 7 on the surface of the semiconductor substrate.

In this case, the second simulation representation 8 corresponds to the first simulation representation 6 from FIG. 6 with the difference that no auxiliary structure imaging 64 is present. For the purpose of better illustration, in FIG. 8 the contact holes 31 to 33 and the auxiliary structure 34, 35, 38 to 45 and 71 of the second phase mask 7 are placed underneath the contact hole imagings 61 to 63 in a manner represented by broken lines. In this case, it can be seen that the corrected auxiliary structure 71 effects no imaging on the surface of the semiconductor substrate.

Figure 9:
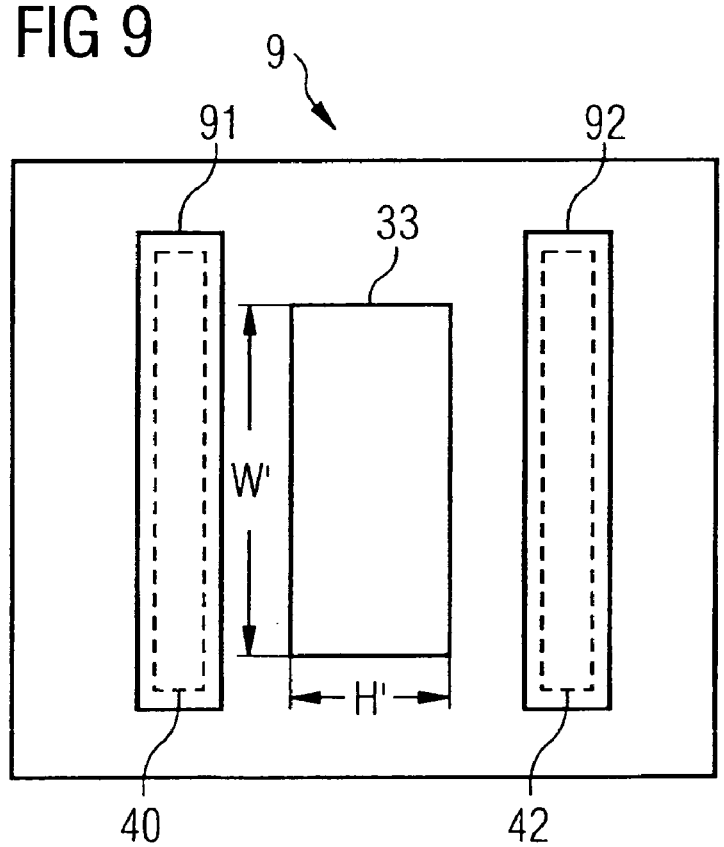
FIG. 9 shows a plan view of a simulation-corrected phase mask region of the second phase mask from FIG. 7.

FIG. 9 shows a plan view of a simulation-corrected phase mask region 9 of the second phase mask 7 from FIG. 7.

In this case, the third contact hole 33 has a horizontal dimension H' and a vertical dimension W', which have been determined in accordance with the bias determination shown in FIG. 5.

The auxiliary structure 40 is represented by broken lines on the left next to the third contact hole 33. Provided around the auxiliary structure 40 is a first simulation-corrected auxiliary structure 91, which is corrected in each case with an identical bias in the horizontal direction and in the vertical direction with respect to the auxiliary structure 40. The first simulation-corrected auxiliary structure 91 likewise has a rectangular form and is enlarged by a bias V in the horizontal direction and in the vertical direction with respect to the auxiliary structure 40. Said bias is a rule-based bias in accordance with method step 18 in order to increase the brightness of the auxiliary structure to an extent such that the expected contrast enhancement occurs.

The auxiliary structure 42 is represented by broken lines on the right next to the third contact hole 33. In the same way as in the case of the first auxiliary structure 40, in the case of the second auxiliary structure 42 as well, provision is made of a second simulation-corrected auxiliary structure 92, which is corrected in each case by a bias V in the horizontal direction and in the vertical direction. Accordingly, the second simulation-corrected auxiliary structure 92 is inflated in each case by a bias V in the horizontal direction and in the vertical direction with respect to the original auxiliary structure 42.

The first exemplary embodiment of the method according to the invention is explained below with reference to FIGS. 1 to 9.

Firstly, the semiconductor substrate design 2 represented in FIG. 2, which is present in the form of geometrical data on a memory area of the computer system, is loaded into the main memory area of the computer system. On the computer system, the construction and the structure of the first phase mask 3 are determined from this semiconductor substrate design 2. In this case, firstly the location and the position of the contact holes 31 to 33 on the mask are determined and then the auxiliary structures 34 to 45 are arranged around these contact holes, positioning rules being employed. The image of the first phase mask 3 can be seen particularly well in FIGS. 3 and 4.

Biases are subsequently determined for the contact holes 31–33, and optical proximity correction method being carried out. The determination of these contact hole biases can be seen particularly well in FIG. 5. In this case, the original contact holes 31 to 33 are corrected by the contact hole biases thus determined. In the subsequent method step, the imaging of the contact holes 31–33 and of the auxiliary structures 34–45 on the semiconductor substrate is simulated. This simulation is represented in FIG. 6. The check then carried out to determine whether the auxiliary structures 34–45 image yields the result that the auxiliary structures 36 and 37 cause the auxiliary structure imaging 64. Deviations of the contact holes 31–33 from the specified tolerances are not ascertained in this method step. This is because the contact hole imagings 61–63 have no excessive deviations from the contact holes 31–33, as can be seen in FIG. 6.

A correction of the auxiliary structures 36 and 37 and a repetition of the last method steps then follow. Firstly, the defect ascertained, namely that the two auxiliary structures 36 and 37 image in an undesirable manner, is compared with the defect classes present in a table or in a database of the computer system. In this case, in the exemplary embodiment, the correction possibility that is found for two auxiliary structures lying one beside the other is that of replacing two auxiliary structures by a single corrected auxiliary structure. In the exemplary embodiment, this replacement is performed by, as can be seen in FIG. 7, the first phase mask 3 being replaced by the second phase mask 7, in which the auxiliary structures 36 and 37 are combined to form a single corrected auxiliary structure 71.

In the then subsequent method step of determination of the contact hole biases by means of an optical proximity correction method, no contact hole biases to be determined are ascertained. Accordingly, renewed correction of the contact holes 31 to 33 does not take place.

The imaging of the second phase mask 7 with the contact holes 31–33 and with the auxiliary structures 34, 35, 38 to 45, 71 is subsequently simulated. This results in the second simulation representation 8 shown in FIG. 8. It can be seen from this second simulation representation that, in the case of the second phase mask 7, no undesired auxiliary structure imagings occur, nor do the contact holes 31–33 deviate from the specified tolerances.

Accordingly, the method according to the invention is continued with the method step: "application of a mask bias for the compensation of three-dimensional mask effects". In this case, a mask bias is determined which is applied to the auxiliary structures 34, 35, 38 to 45, 71. This results in an improved imaging of the contact holes 31 to 33 on the surface of the semiconductor substrate. As can be seen particularly well in FIG. 9 with reference to the first simulation-corrected phase mask region 9, the auxiliary structures 40 and 42 have a mask bias applied to them and are replaced by the simulation-corrected auxiliary structures 91 and 92 that are enlarged in the x and y directions. In the exemplary embodiment, this is implemented only in a simplified manner by way of example for the right-hand region of the second phase mask 7. In the event of application to the entire second phase mask 7, all the auxiliary structures 34, 35, 38, 39, 41, 43–45 and 71 have the determined mask bias applied to them and are correspondingly enlarged. This results in an improved imaging of the edges of the contact holes 31–33. In order to determine this mask bias, the measured light intensity is compared with the simulated light intensity on the surface of the semiconductor substrate and from this a correction value is determined which is applied to all the auxiliary structures 34, 35, 38, 39, 41, 43–45 and 71.

The second phase mask determined in this way with its contact holes 31 to 33 and with its auxiliary structures can now serve as artwork for the fabrication of a real phase mask.

Figure 10:
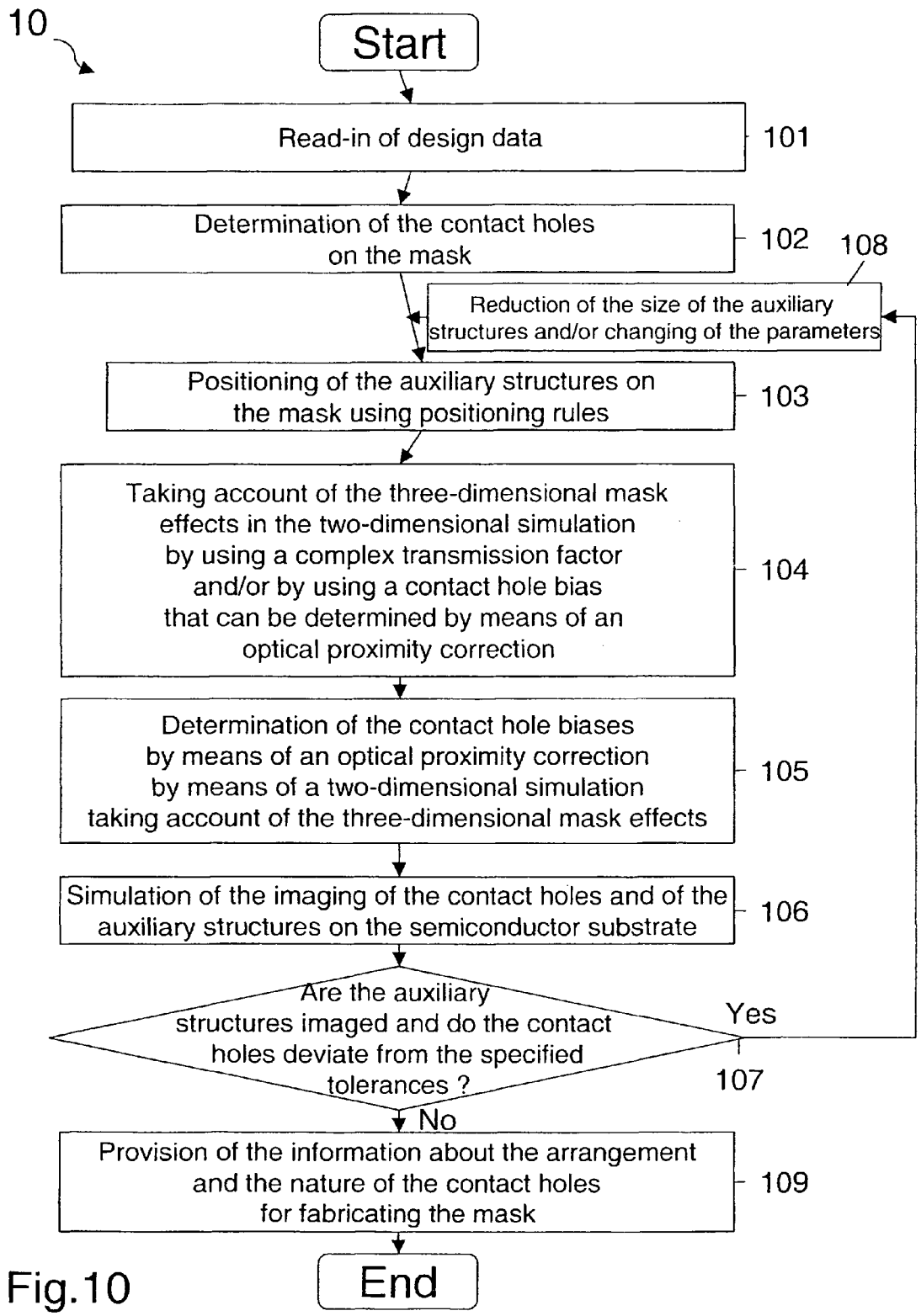
FIG. 10 shows a second flow diagram for illustrating a second method according to the invention for determining the construction of a mask.

FIG. 10 shows a second flow diagram 10 with the method steps 101–109 for illustrating a second method according to the invention for determining the construction of a mask.

The first three method steps 101, 102 and 103 correspond to method steps 11, 12 and 13 of the first flow diagram 1 shown in FIG. 1.

After the determination of the contact holes and the positioning of the auxiliary structures on the mask, the fourth method step 104 is carried out, in which the three-dimensional mask effects are taken into account in the simulation. This is because, during the projection of the mask onto the surface of the semiconductor substrate, optical effects are manifested which are caused by the three-dimensional construction of the mask and are not taken into account, or are taken into account only to an insufficient extent, by the two-dimensional projection used during the simulation. As a result of this type of deviation of the measured from the calculated light intensity on the surface of the semiconductor substrate, unrecognized or undesirable structures which can impair the functionality of the semiconductor substrate produced or of the semiconductor chips produced may result on the surface of the semiconductor substrate. A simulation which works with two-dimensional projection methods generally gives rise to a significantly brighter light distribution on the surface of the semiconductor substrate than is observed in reality. Accordingly, the object that arises is to make the simulation truer to reality.

This is achieved in method step 104, in which the three-dimensional mask effects are taken into account in the simulation. This can be done by carrying out a three-dimensional simulation. However, such a three-dimensional simulation is characterized by a very long computation time and is therefore ruled out for the method according to the invention for reasons of practicality. Accordingly, a two-dimensional simulation is carried out in which it is attempted concomitantly to take account of the three-dimensional mask effects.

A complex transmission factor and/or a contact hole bias that can be determined by means of an optical proximity correction method may be used for this purpose. When using a complex transmission factor the transmission of the contact holes and of the auxiliary structures is determined either experimentally or by rigorous mask simulation and the measured values are compared with the simulated values. A complex transmission factor can be derived from this and is applied to the contact holes and/or the auxiliary structures in the simulation. The complex transmission is defined mathematically as the variation of brightness and phase and is expressed by the following formula:

$$T_{complex} = \sqrt{T} \cdot \exp[j \cdot \varphi]$$

where j=sqrt(−1) represents the complex root of unity, T represents the transmission of the light intensity and j represents a phase shift.

It is likewise possible to take account of the three-dimensional mask effects by means of a contact hole bias. This contact hole bias is calculated analogously to the optical proximity correction method shown in FIG. 5. The contact hole bias calculated in this way is applied to the contact holes, the contact holes generally being enlarged as a result.

By taking account of the three-dimensional mask effects in method step 104, it is ensured that only slight deviations of the simulated light intensity on the surface of the semiconductor substrate from the measured light intensity result. Computer-implemented algorithms, so-called full chip simulators, are used in such two-dimensional simulation methods.

A method which incorporates three-dimensional optical effects into a conventional two-dimensional simulation is disclosed in document [4].

Method step 104 relates exclusively to the simulation program. No contact holes and/or auxiliary structures are changed in this method step 104. The two-dimensional simulation is merely adapted to a three-dimensional simulation.

In the subsequent method step 105, the contact hole biases are determined—analogously to the first exemplary embodiment—by means of an optical proximity correction method. In contrast to the first exemplary embodiment, at this point use is made of a two-dimensional simulation which takes account of the three-dimensional mask effects, as described above.

The imaging of the contact holes and the auxiliary structures on the semiconductor substrate is simulated in the subsequent method step 106. Afterwards, a check is made to determine whether auxiliary structures are imaged in an undesirable manner and/or whether the contact holes deviate from the specified tolerances. If this is the case, then the auxiliary structures are reduced in size and/or parameters are changed. In this case, the measures to be performed correspond to those of method step 17 from FIG. 1. The changing of parameters may be realized in terms of combining auxiliary structures, enlarging distances or erasing auxiliary structures. Afterwards, the last method steps are repeated in a loop-like manner starting from the method step of positioning auxiliary structures on the mask.

If the check reveals that no auxiliary structures are imaged on the surface of the semiconductor substrate and that no contact holes deviate from the specified tolerances, then the information about the arrangement and about the nature of the contact holes and of the auxiliary structures which have been modified by the method according to the invention is provided for fabricating a real mask.

FIG. 11 shows a simulation adaptation representation 11 with a plan view of a second simulation-corrected phase mask region 12 and with a transmission representation 13.

The simulation adaptation representation 11 is subdivided into the third contact hole 33 and the auxiliary structures 40 and 42 arranged next to the latter on the left and right. In this case, the third contact hole 33 and the auxiliary structures 40 and 42 are respectively corrected by a demagnifying bias. A simulation-corrected contact hole 121, which is made slightly smaller than the third contact hole 33, and simulation-corrected auxiliary structures 122 and 123, which are in each case made slightly smaller than the auxiliary structures 40 and 42, are thus produced. With regard to their form and their arrangement, the simulation-corrected contact hole 121 and the simulation-corrected auxiliary structures 122 and 123 respectively correspond to the third contact hole 33 and the auxiliary structures 40 and 42.

The transmission representation 13 illustrates the light intensity on the surface of the semiconductor substrate considered, calculated by means of conventional simulations. The transmission representation 13 represents three simulations each having three intensity distributions arranged next to one another, the middle intensity distribution being significantly more highly pronounced than the left-hand and right-hand intensity distributions, and the height of the left-hand and right-hand intensity distributions being the same in each case.

A two-dimensional simulation 131, represented by a solid line in FIG. 11, respectively has the highest light intensity distribution on the surface of the semiconductor substrate. A three-dimensional simulation 133, represented by a dotted line in FIG. 11, respectively has a significantly lower light intensity distribution on the surface of the semiconductor substrate. A two-dimensional bias-corrected simulation 132 is represented by a dashed line between the two-dimensional simulation 131 and the three-dimensional simulation 133. Said simulation 132 visualizes a light intensity distribution on the surface of the semiconductor substrate which is made only slightly larger than the light intensity distribution in the case of the three-dimensional simulation 133, but has a profile significantly below the light intensity distribution in accordance with the two-dimensional simulation 131.

The transmission representation 13 makes a statement that the two-dimensional simulation produces a significantly higher light intensity distribution on the surface of the semiconductor substrate than is calculated by the three-dimensional simulation 133 and is the case in reality. The two-dimensional bias-corrected simulation 132 represents a satisfactory approximation to the three-dimensional simulation 133 that is optimal in respect of computation time.

Relating to the second simulation-corrected phase mask region 12, this means that with the use of the phase mask region 4 having the third contact hole 33 and the auxiliary structures 40 and 42, the light intensity distribution of the two-dimensional simulation 131 is obtained on the surface of the semiconductor substrate. If use is made of the second simulation-corrected phase mask region with the simulation-corrected contact hole 121 and the simulation-corrected auxiliary structures 123, then the light intensity distribution of the two-dimensional bias-corrected simulation 132 is produced.

FIG. 12 shows a plan view of a third simulation-corrected phase mask region 14.

In this case, the third simulation-corrected phase mask region 14 corresponds to the second simulation-corrected phase mask region 12 from FIG. 11 with the difference that the simulation-corrected contact hole 141 and the simulation-corrected auxiliary structures 142 and 143 have rounded corners.

The performance of the method according to the invention in accordance with the second exemplary embodiment is illustrated below with reference to FIGS. 10, 2 to 4, 11 and 5 to 8.

At the beginning, the semiconductor substrate design 2 in accordance with FIG. 2 is read into a main memory area of the computer. The first phase mask 3—represented in FIG. 3—with its contact holes 31 to 33 and with its auxiliary structures 34 to 45 is subsequently produced on the computer system.

Then, as can be seen particularly well in FIG. 11, a contact hole bias is determined and the first phase mask 3 is corrected by application of this contact hole bias. A two-dimensional simulation of the imaging of the first phase mask 3 on the surface of the semiconductor substrate is performed for this purpose. The light intensity distribution thus simulated on the surface of the semiconductor substrate is compared either with the results of a three-dimensional simulation that is likewise to be carried out or with the real light intensity distribution which has been determined experimentally. In this case, a difference is ascertained and is included in the simulation by means of a contact hole bias. In accordance with FIG. 11, it is ascertained that the simulated light intensity distribution is too bright relative to the light intensity distribution ascertained in reality on the surface of the semiconductor substrate. Accordingly, the contact holes 31–33 and the auxiliary structures 34–45 are reduced in size by a bias in the simulation then to be employed. This bias is used exclusively for the simulation and is not manifested again in the contact holes and auxiliary structures to be produced.

Instead of the provision of such a contact hole bias or in addition thereto, it is possible to employ a complex transmission factor which can be used to take account of the three-dimensional mask effects in the two-dimensional simulation. The simulated transmission is compared with the measured transmission for this purpose. A transmission factor can be calculated from this, which can be applied to the contact holes 31–33 and to the auxiliary structures 34–45.

Such reduction of the size of the contact holes 31–33 and of the auxiliary structures 34–45 during the simulation results in a truer-to-reality imaging of the first phase mask 3 on the surface of the semiconductor substrate with a low light intensity distribution. This is attributable, in particular, to the changed transmission and to the changed phase.

Contact hole biases are subsequently determined for the contact holes 31–33. In this case, use is made of an optical proximity correction method described for the contact hole 33 in FIG. 5. In this exemplary embodiment, this optical proximity correction method uses the three-dimensional mask effects in a manner described above. A contact hole bias dx in the horizontal direction and a contact hole bias dy in the vertical direction are determined by means of this optical proximity correction method. The contact holes, since they image too small, as shown in FIG. 5, are enlarged by said contact hole biases. The formulae mentioned in the explanation of the first exemplary embodiment are used in this case.

The simulation of the imaging of the contact holes 31–33 and of the auxiliary structures 34–45 on the surface of the semiconductor substrate is then effected. The two-dimensional simulation taking account of three-dimensional mask effects is used in this case. In accordance with FIG. 6, it can be seen that an undesired auxiliary structure imaging 64 is simulated on the surface of the semiconductor substrate. Accordingly, the auxiliary structures 36 and 37 are corrected by the new corrected auxiliary structure 71. The second phase mask 7 thus obtained is shown in FIG. 7.

Since the contact holes are imaged on the surface of the semiconductor substrate with sufficiently good accuracy, no further contact hole bias is calculated. The imaging of the second phase mask 7 on the surface of the semiconductor substrate is simulated in the subsequent method step. The three-dimensional mask effects are also taken into account here in the two-dimensional simulation. This results in the second simulation representation 8 in accordance with FIG. 8. No undesirable imagings of the auxiliary structures 34, 35, 38, 39, 41, 43–45 and 71 are present in this second simulation representation 8. Furthermore, the contact hole imagings 61 to 63 are within the specified tolerances. The check as to whether auxiliary structures image or whether the contact holes are within the specified tolerances is thus concluded.

The second phase mask 7 determined by this method according to the invention is then taken as artwork for the fabrication of a real phase mask.

In a third exemplary embodiment, the procedure is analogous to the second exemplary embodiment described above with the difference that when taking account of three-dimensional mask effects in the case of the two-dimensional simulation, in addition to the contact hole bias, a rounding of the corners of the contact holes 31–33 and of the auxiliary structures 34–45 and 71 is performed in each case. This can be seen particularly well in FIG. 12. In the same way as the contact hole bias determined in FIG. 12, this rounding of the corners relates only to the simulation, and not to the mask data to be produced.

The following documents were cited in the context of this document:

[1] Resolution Enhancement Techniques in Optical Lithography. Alfred Kwok-Kit Wong. Vol. TT47, SPIE Press, 2001.
[2] Proximity Effects of Alternating Phase Shift Masks. Maurer, Wilhelm et al. SPIE 1999.
[3] Phase and Transmission Errors Aware OPC Solution for PSM: Feasibility Demonstration. Toublan, Olivier et al., Mentor Graphics, Baccus 2000.
[4] Simplified Models for Edge Transitions in Rigorous Mask Modeling. Adam, Konstantinos et al., University of California at Berkeley, SPIE 2001.

We claim:

1. A method for determining the construction of a mask for the micropatterning of semiconductor substrates by means of photolithography, the method being carried out on a computer system and comprising the steps of:
   a) read-in of design data of a semiconductor substrate,
   b) determining the form and the arrangement of contact holes of a mask image present as a data structure,
   c) determining the form and the arrangement of auxiliary structures in the mask image by means of positioning rules,
   d) applying a mask bias during the imaging simulation of the mask image for the compensation of three-dimensional mask effects, the mask bias being compared by comparison of a simulated light intensity distribution on the semiconductor substrate with a light intensity distribution on the semiconductor substrate determined experimentally or by means of a rigorous mask simulation,
   e) providing the information about the form and about the arrangement of the contact holes and of the auxiliary structures of the mask image for the fabrication of the mask.

2. The method according to claim 1, wherein, after step c), the following steps are performed:
   c1) determining at least one contact hole bias by means of an optical proximity correction method and changing of the size of the contact holes in the mask image by the contact hole bias or by the contact hole biases,
   c2) simulating the imaging of the contact holes and of the auxiliary structures of the mask image on the semiconductor substrate,
   c3) checking whether the auxiliary structures are imaged on the semiconductor substrate during the simulation and/or whether the contact holes on the semiconductor substrate deviate from specified tolerances,
      if so: sorting of the relevant contact holes and/or of the relevant auxiliary structures according to defect classes, changing of the contact holes and/or of the auxiliary structures in the mask image, and repetition of steps c), c1), c2) and c3).

3. The method according to claim 1, wherein rounded corners of the contact holes and of the auxiliary structures of the mask image are taken into account during the simulation in step d).

4. The method according to claim 1, wherein the optical proximity correction method is performed in a rule-based manner.

5. The method according to claim 1, wherein the optical proximity correction method is performed in a simulation-based manner.

6. The method according to claim 1, wherein in the case of the mask, auxiliary structures or the main structure are or is etched anisotropically.

7. The method according to claim 1, wherein in the case of the mask, auxiliary structures or the main structure are or is preetched anisotropically and undercut isotropically on one side or on two sides.

8. The method according to claim 1, wherein the mask is a phase assist mask with non-imaging auxiliary structures.

9. The method according to claim 1, wherein the mask is a halftone mask with scatter lines.

10. The method according to claim 1, wherein the mask is a halftone mask with phase auxiliary structures.

11. The method according to claim 1, wherein the mask is a COG mask with scatter lines.

12. A method for determining the construction of a mask for the micropatterning of semiconductor substrates by means of photolithography, the method being carried out on a computer system and comprising the steps of:
   a) read-in of design data of a semiconductor substrate,
   b) determining the form and the arrangement of contact holes of a mask image present as a data structure,
   c) determining the form and the arrangement of auxiliary structures in the mask image by means of positioning rules,
   d) taking account of three-dimensional mask effects in the imaging simulation of the mask image on the semiconductor substrate by using a complex transmission factor and/or by using a contact hole bias that can be determined by means of an optical proximity correction method,
   e) determining the contact hole biases by means of an optical proximity correction method by means of the imaging simulation taking account of the three-dimensional mask effects, and changing of the size of the contact holes in the mask image by the contact hole bias or by the contact hole biases,
   f) providing the information about the form and about the arrangement of the contact holes and of the auxiliary structures of the mask image for the fabrication of the mask.

13. The method as claimed in claim 12, wherein, after step e), the following steps are performed:
   e1) simulation of the imaging of the contact holes and of the auxiliary structures of the mask image on the semiconductor substrate by means of the imaging simulation taking account of three-dimensional mask effects,
   e2) checking whether the auxiliary structures are imaged on the semiconductor substrate during the simulation and/or whether the contact holes on the semiconductor substrate deviate from specified tolerances,
      if so: sorting of the relevant contact holes and/or of the relevant auxiliary structures according to defect classes, changing of the contact holes and/or of the auxiliary structures in the mask image, and repetition of steps c), d), e), e1), and e2).

14. The method according to claim 12, wherein rounded corners of the contact holes and of the auxiliary structures of the mask image are taken into account during the simulation in step d).

15. The method according to claim 12, wherein the optical proximity correction method is performed in a rule-based manner.

16. The method according to claim 12, wherein the optical proximity correction method is performed in a simulation-based manner.

17. The method according to claim 12, wherein in the case of the mask, auxiliary structures or the main structure are or is etched anisotropically.

18. The method according to claim 12, wherein in the case of the mask, auxiliary structures or the main structure are or is preetched anisotropically and undercut isotropically on one side or on two sides.

19. The method according to claim 12, wherein the mask is a phase assist mask with non-imaging auxiliary structures.

20. The method according to claim 12, wherein the mask is a halftone mask with scatter lines.

21. The method according to claim 12, wherein the mask is a halftone mask with phase auxiliary structures.

22. The method according to claim 12, wherein the mask is a COG mask with scatter lines.

23. A computer program with program instructions stored or contained within one of the means within the group consisting of: on a storage medium, in a computer memory, in a read-only memory which cause a computer system to execute a method for determining the construction of a mask according to claim 1.

24. The computer program according to claim 23 which is transmitted on an electrical carrier signal.

25. A carrier medium, in particular data carrier, on which is stored a computer program containing program instructions which cause a computer system to execute a method for determining the construction of a mask according to claim 1.

26. A computer system, on which a computer program according to claim 23 is stored.

27. A method for loading a computer program for determining the construction of a mask, wherein in one step of the method a computer program according to claim 23 is being downloaded from an electronic data network, such as from the Internet, for example, onto a computer system connected to the electronic data network.

* * * * *